(12) United States Patent
Chan et al.

(10) Patent No.: US 10,224,479 B2
(45) Date of Patent: *Mar. 5, 2019

(54) PHASE CHANGE MEMORY STACK WITH TREATED SIDEWALLS

(71) Applicant: Micron Technology, Inc., Boise, ID (US)

(72) Inventors: Tsz W. Chan, Boise, ID (US); Yongjun Jeff Hu, Boise, ID (US); Swapnil Lengade, Boise, ID (US); Shu Qin, Boise, ID (US); Everett Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/882,666

(22) Filed: Jan. 29, 2018

(65) Prior Publication Data

US 2018/0166629 A1   Jun. 14, 2018

Related U.S. Application Data

(60) Continuation of application No. 15/090,292, filed on Apr. 4, 2016, now Pat. No. 10,079,340, which is a division of application No. 14/266,415, filed on Apr. 30, 2014.

(51) Int. Cl.
| | |
|---|---|
| *H01L 45/00* | (2006.01) |
| *G11C 13/00* | (2006.01) |
| *H01L 27/24* | (2006.01) |

(52) U.S. Cl.
CPC .......... *H01L 45/06* (2013.01); *G11C 13/0004* (2013.01); *H01L 27/2409* (2013.01); *H01L 27/2481* (2013.01); *H01L 45/12* (2013.01); *H01L 45/1233* (2013.01); *H01L 45/1253* (2013.01); *H01L 45/141* (2013.01); *H01L 45/16* (2013.01); *H01L 45/165* (2013.01); *H01L 45/1616* (2013.01); *H01L 45/1675* (2013.01)

(58) Field of Classification Search
None
See application file for complete search history.

(56) References Cited

U.S. PATENT DOCUMENTS

| | | |
|---|---|---|
| 6,143,124 A | 11/2000 | Ahn |
| 9,281,471 B2 | 3/2016 | Hu et al. |
| 9,306,159 B2 | 4/2016 | Chan et al. |

(Continued)

OTHER PUBLICATIONS

Liu, Zheng, et al., "Ultrathin high-temperature oxidation-resistant coatings of hexagonal boron nitride", Nature Communications, 4(2541), (Oct. 4, 2013), 1-8.

*Primary Examiner* — Mounir S Amer
(74) *Attorney, Agent, or Firm* — Schwegman Lundberg & Woessner, P.A.

(57) ABSTRACT

Memory devices and methods for fabricating memory devices have been disclosed. One such method includes forming the memory stack out of a plurality of elements. An adhesion species is formed on at least one sidewall of the memory stack wherein the adhesion species has a gradient structure that results in the adhesion species intermixing with an element of the memory stack to terminate unsatisfied atomic bonds of the element. The gradient structure further comprises a film of the adhesion species on an outer surface of the at least one sidewall. A dielectric material is implanted into the film of the adhesion species to form a sidewall liner.

16 Claims, 9 Drawing Sheets

(56) References Cited

U.S. PATENT DOCUMENTS

| | | |
|---|---|---|
| 9,673,256 B2 | 6/2017 | Hu et al. |
| 2012/0224413 A1 | 9/2012 | Zhang et al. |
| 2012/0241705 A1 | 9/2012 | Bresolin et al. |
| 2013/0128649 A1 | 5/2013 | Quick et al. |
| 2015/0123066 A1 | 5/2015 | Gealy et al. |
| 2015/0318038 A1 | 11/2015 | Hu et al. |
| 2015/0318467 A1 | 11/2015 | Hu et al. |
| 2015/0318468 A1 | 11/2015 | Chan et al. |
| 2016/0190209 A1 | 6/2016 | Hu et al. |
| 2016/0218282 A1 | 7/2016 | Chan et al. |
| 2017/0358629 A1 | 12/2017 | Hu et al. |
| 2018/0144795 A1 | 5/2018 | Hu et al. |

PHASE CHANGE MEMORY STACK WITH TREATED SIDEWALLS

PRIORITY APPLICATION

This application is a continuation of U.S. application Ser. No. 15/090,292, filed Apr. 4, 2016, which is a divisional of U.S. application Ser. No. 14/266,415, filed Apr. 30, 2014, now issued as U.S. Pat. No. 9,306,159, all of which are incorporated herein by reference in their entireties.

BACKGROUND

Memory devices are typically provided as internal, semiconductor, integrated circuits in apparatuses such as computers or other electronic devices. There are many different types of memory including random-access memory (RAM), read only memory (ROM), dynamic random access memory (DRAM), synchronous dynamic random access memory (SDRAM), and non-volatile (e.g., phase change memory, flash) memory.

Non-volatile memories are important elements of integrated circuits due to their ability to maintain data absent a power supply. Phase change materials have been investigated for use in non-volatile memory cells. Phase change memory (PCM) elements include phase change materials, such as chalcogenide alloys, that are capable of stably transitioning between amorphous and crystalline phases. Each phase exhibits a particular resistance state and the resistance states distinguish the logic values of the memory element. Specifically, an amorphous state exhibits a relatively high resistance and a crystalline state exhibits a relatively low resistance. One of different logic levels (e.g., logic 1 or logic 0) can be assigned to each of these states.

There are general needs to improve PCM devices.

DETAILED DESCRIPTION

As described subsequently, a method for fabricating a memory stack (e.g., memory device) with treated sidewalls can increase the adhesion of dielectric passivation material to the electrodes. This can reduce inter-diffusion between the electrodes and adjacent materials in the memory stack.

Figure 1:
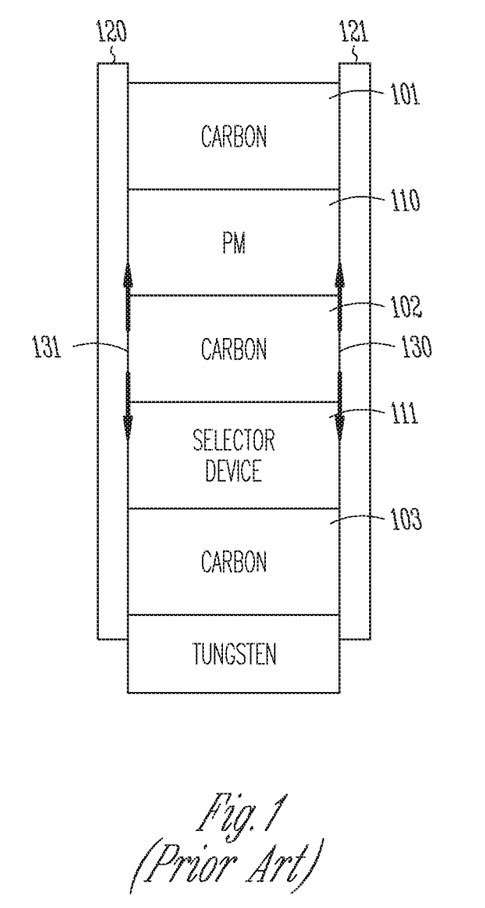
FIG. 1 illustrates a cross-sectional view of a typical phase change memory stack.

FIG. 1 illustrates a typical memory cell stack for a PCM. Carbon can be used as top 101, middle 102, and bottom 103 electrodes for the memory cell stack. Carbon is chemically inert and does not react easily with the phase change material 110 or the selector device material 111. This inert chemistry can also lead to poor adhesion of sidewalls to the carbon electrodes. As a result, it can be possible for the sidewall material 120, 121 to inter-diffuse 130, 131 between the selector device material 111 and the phase change material 110. This can occur at higher local temperatures during device operation. The inter-diffusion can cause reliability issues, degrade leakage current, and affect threshold voltage stability.

FIGS. 2-7 illustrate various steps in fabricating a memory stack (e.g., PCM) in addition to treating the sidewalls of the memory stack with an adhesion species. These fabrication steps are for purposes of illustration only as the different elements of the stack can be formed by different processes.

Figure 2:
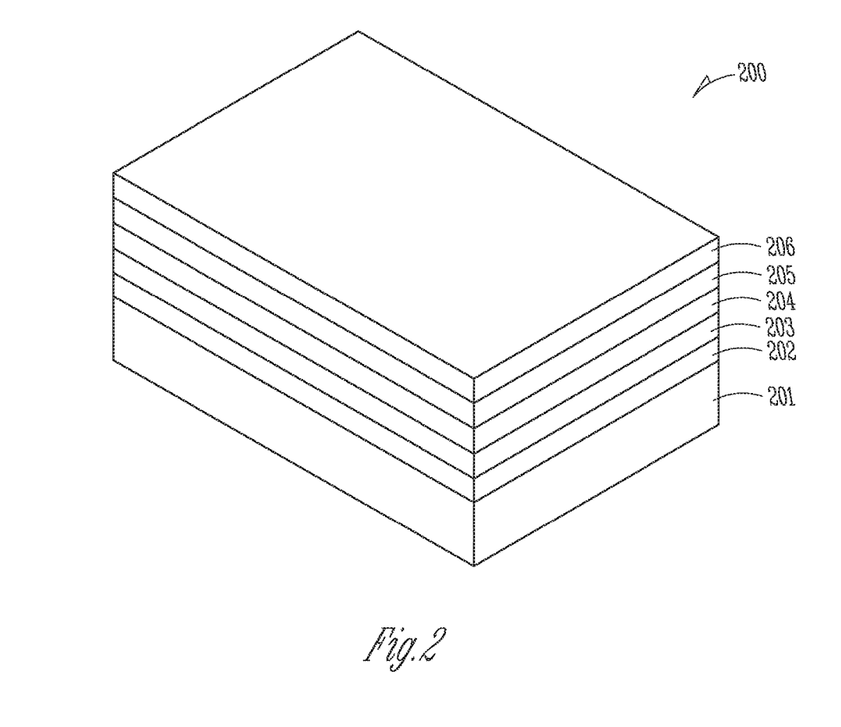
FIGS. 2-7 illustrate an embodiment of a process flow to fabricate a phase change memory stack having treated sidewalls.

FIG. 2 illustrates an embodiment of a blanket deposition of the initial memory stack material 200. The memory stack can include a word line material (e.g., tungsten (W)) 201. A first electrode material 202 (e.g., carbon) can be formed on the word line material 201. A selector device material 203 may be formed on the first electrode material 202.

The selector device material 203 (SD) may include Selenium (Se), Arsenic (As), Germanium (Ge), Tin (Sn), Tellurium (Te), Silicon (Si), Lead (Pb), Carbon (C), or Bismuth (Bi) as well as other materials. Other embodiments can include selector device material 203 comprising one or more of these elements as well as one or more of these elements combined with other elements.

A second electrode material 204 (e.g., carbon) can be formed on the selector device material 203. A phase change material 205 can be formed on the second electrode material 204.

The phase change material 205 (PM) can include chalcogenide elements such as Germanium (Ge), Antimony (Sb), Tellurium (Te), Indium (In) as well as other chalcogenide elements, combinations of these elements, or combinations of these element with other elements. The phase change material 205 can additionally include Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), or Platinum (Pt) as well as other elements. Additional embodiments can combine these elements with the chalcogenide elements.

A third electrode material 206 (e.g., carbon) can be formed on the phase change material 205. Forming the third electrode material 206, as well as the other materials 201-205 of the memory stack, can be done with a blanket deposition method or some other deposition method.

Figure 3:
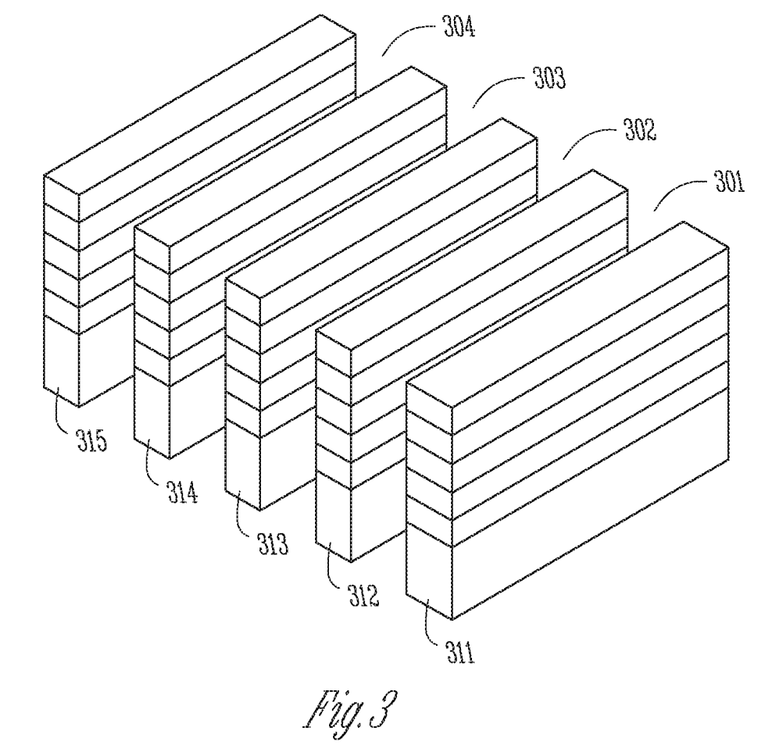

After the initial memory stack material 200 has been formed, an etch process (e.g., dry etch) can be performed on the stack material 200 to create trenches 301-304 as illustrated in FIG. 3. FIG. 3 illustrates that the stack material 200 has been divided by the plurality of trenches 301-304 into a plurality of memory stacks 311-315, each stack comprising the architecture illustrated in FIG. 2.

Figure 7:
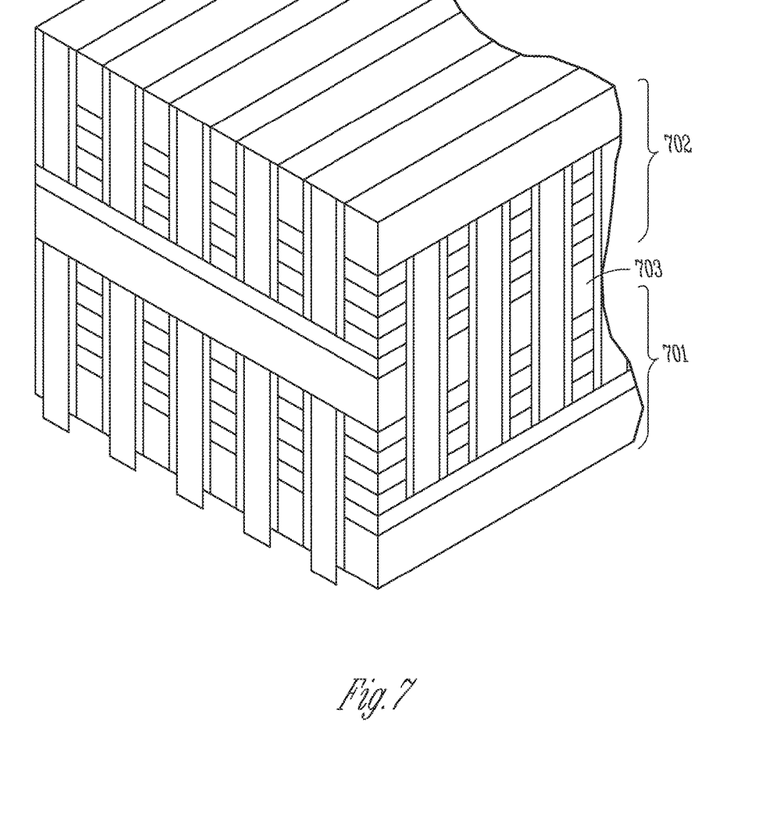

In another embodiment, the stack material 200 can be dry etched patterned in both x and y directions. Thus, subsequent sidewall liners can be added on four sidewalls, as illustrated in FIG. 7.

Figure 4:
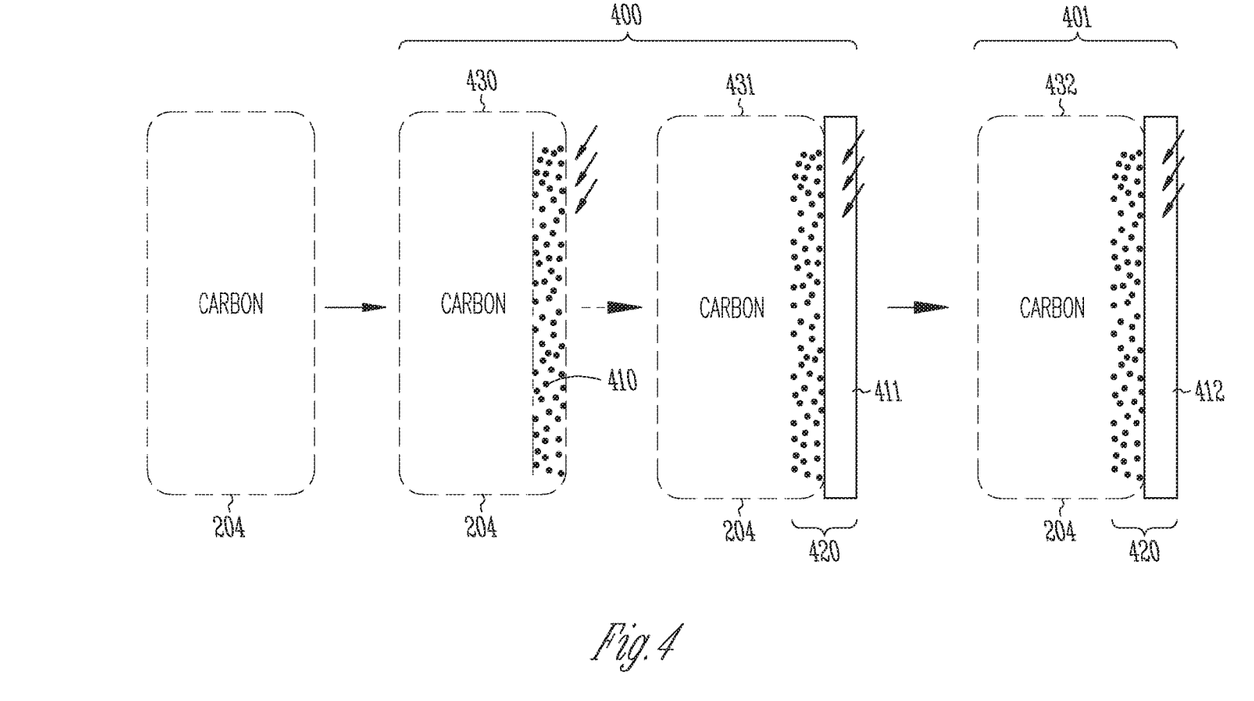

FIG. 4 illustrates the treatment of the sidewalls of particular ones of the stack 311-315 as formed in FIG. 3. This treatment enhances the dielectric liner adhesion to the electrode surfaces. In an embodiment, a plasma immersion technique (e.g., plasma doping) can be used to implant an adhesion species in the stack sidewalls and deposit a dielectric liner (e.g., nitride). While FIG. 4 illustrates the treatment process with regard to only one sidewall of one electrode, the sidewalls of the other electrodes can experience a similar process.

The sidewall treatment process illustrated in FIG. 4 includes a step 430 of implanting the sidewall of the carbon electrode(s) 204 with an adhesion species (e.g., boron) using a relatively low energy (e.g., <3 k eV) plasma doping (PLAD) process 400. This can be accomplished by exposing the sidewall to a diborane gas ($B_2H_6$) resulting in a B—C layer 410 as a result of the boron terminating unsatisfied atomic bonds of the carbon.

A subsequent step 431 includes depositing a boron film 411 on the electrode 204. As a result of the PLAD implant/deposition process 400, a gradient structure 420 of B—C bonds and the boron film is formed that can be approximately 1-6 nm thick.

Another step 432 includes implanting a dielectric material (e.g., nitride (N)) into the B—C gradient 420. For example, a relatively low energy (e.g., 0-2 k eV) $NH_3$ or $N_2/H_2$ PLAD process 401 can implant nitrogen atoms into the boron film 411 to form a $BN_X$ film 412 on the carbon electrode 204 sidewall. The $BN_X$ film 412 can be referred to as the sidewall liners or dielectric liners.

The process illustrated in FIG. 4 can result in a dielectric liner 412 that can be a few atomic layers thick. If a thicker $BN_X$ film is desired, the process of FIG. 4 can be repeated.

Relatively low energy plasma immersion implant can have advantages if used in this process. For example, conformal doping can be used in the process in order to achieve a tunable implant/deposition operation regime and a shallow profile. The ion bomb bombardment nature of an implant process can enhance an adhesion-friendly species (e.g., boron) by intermixing with the electrode material. For example, the implanted boron can improve adhesion by species intermixing and terminating unsatisfied atomic bonds (e.g., carbon bonds). Other adhesion species besides boron that have similar properties can also be used. This process can be accomplished at approximately room temperature. To form the PCM cells, electrically insulated pillars are formed (e.g., by dry etching) in the hit line direction while the memory stacks are formed in the word line direction.

Figure 5:
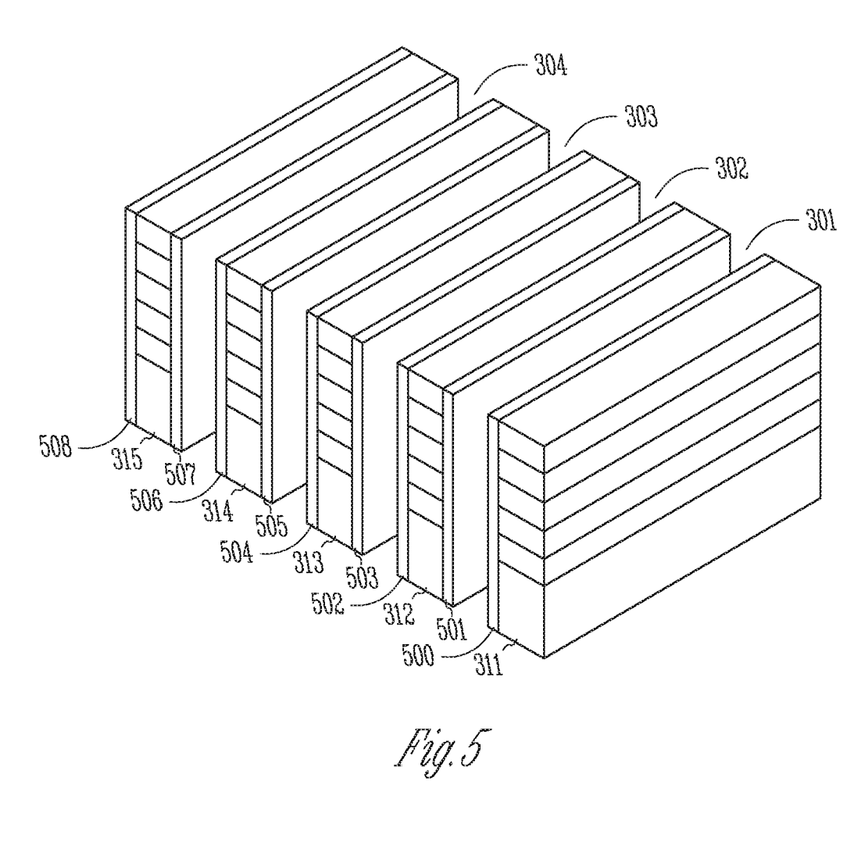

FIG. 5 illustrates the stacks 311-315 as a result of forming the sidewall liners 500-508 on the sidewalk of the stacks 311-315 as seen in FIG. 4. The process to form the sidewall liners 500-508 can use any dielectric material that can be implanted into the adhesive species film 411. For purposes of illustration, a dielectric material like $AlSiO_x$ can be used.

Figure 6:
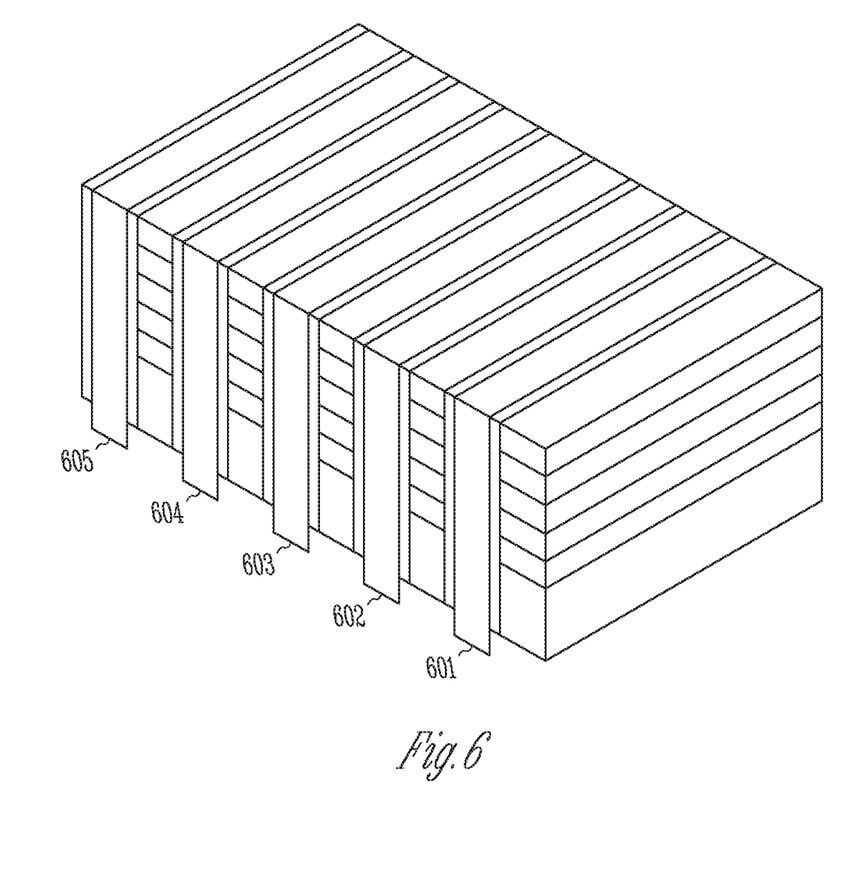

FIG. 6 illustrates an embodiment for forming a dielectric fill material 601-604 between adjacent memory stacks. The dielectric fill material 601-604 can electrically isolate each of the memory stacks. The dielectric fill material 601-604 can be the same material as the sidewall liners 500-508 or a different dielectric material.

FIG. 7 illustrates an embodiment for forming additional decks of memory stacks. For example, FIG. 7 shows two memory stacks 701, 702 coupled together at a common bit line 703. The sidewalls or the sidewall liner treatment described previously with reference to FIG. 4 and below with reference to FIG. 8 may be repeated for the memory stacks at each of the decks. Other embodiments can have additional decks of memory stacks 701, 702. This embodiment can be obtained by a patterned dry etch process in both the x-direction and the y-direction and the liner added to the far side sidewall.

The represented sequence of layers is for purposes of illustration only. Other embodiments can use other sequences. For example, the relative position of the PM and select material (SD) may be exchanged. Also, the relative positions of word line material and bit line material may be changed (e.g., having hit lines at the bottom of the first deck and word lines at the top of the first deck and possibly shared with a second deck stack.

Figure 8:
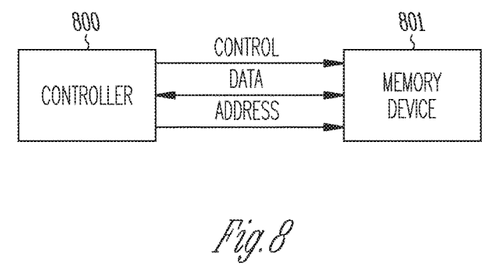
FIG. 8 illustrates a block diagram of a memory system in accordance with the embodiments of FIGS. 2-7.

FIG. 8 illustrates a block diagram of a memory system that include a memory device 801 that can use the memory stacks with treated sidewalls of FIGS. 2-7. A controller 800 may be used to control operations of the system. The memory device 801, coupled to the controller 800, may include a memory array comprising memory cell stacks as described above with reference to FIGS. 2-7.

The controller 800 may be coupled to the memory device 801 over control, data, and address buses. In another embodiment, the address and data buses may share a common input/output (I/O) bus. The controller 800 can be part of the same integrated circuit as the memory device 801 or as separate integrated circuits.

Figure 9:
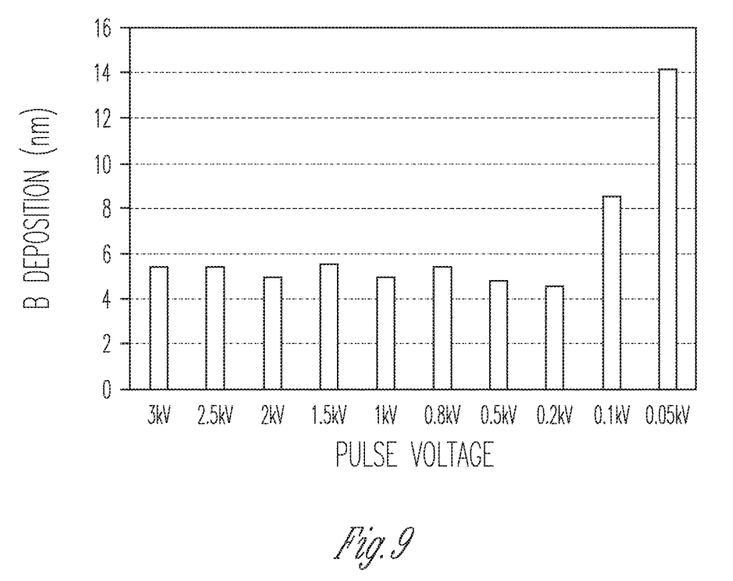
FIG. 9 illustrates a plot of adhesion species deposition depth versus pulse voltage.

FIG. 9 illustrates a plot of adhesion species (e.g., boron) deposition depth (in nanometers) versus pulse voltage. This plot assumes a $B_2H_6/H_2$ PLAD process. The plot shows that the boron deposition layer thickness can be increased at relatively low energy (e.g., <200 eV) and low temperature (e.g., <approximately 390° C.). Implant mode begins to increase at approximately 200V.

Figure 10:
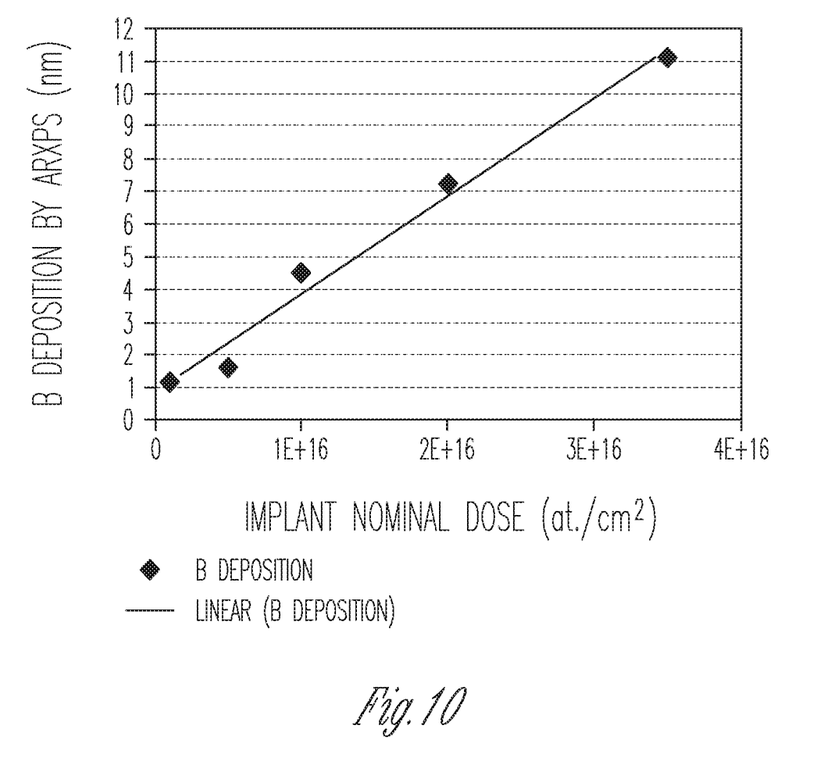
FIG. 10 illustrates a plot of adhesion species deposition depth versus implant nominal dose.

FIG. 10 illustrates a plot of adhesion species (e.g., boron) deposition depth (in nanometers) versus implant nominal dose (in atmospheres/centimeter). This plot shows that, even for higher energy (e.g., >3 k eV), the implant/deposition intermixing mode can increase the adhesion species deposition thickness with dose.

As used herein, an apparatus may refer to, for example, circuitry, an integrated circuit die, a memory device, a memory array, or a system including such a circuit, die, device or array.

CONCLUSION

One or more embodiments of the method for memory stack sidewall treatment can result in a memory device with memory stacks having enhanced adhesion to the sidewall liners. For example, an adhesion species (e.g., boron) can intermix with particular materials of the memory stack to create better adhesion and, thus, reduced sidewall material inter-diffusion. The adhesion species can be implanted in the sidewalls using a PLAD implant/deposition process to form a gradient of boron film and an atomic intermixed structure of boron and carbon. A dielectric forming material (e.g., N) can then be implanted into the film to form a $BN_X$ sidewall liner.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A method of fabricating a memory stack, comprising:
   forming the memory stack comprising multiple stacked elements, the memory stack defined in part by sidewalls;
   forming an adhesion species on at least one sidewall of the memory stack, including intermixing the adhesion species with an element of the memory stack, and further including forming a film of the adhesion species on an outer surface of the intermixed adhesion species; and
   implanting a dielectric material into the adhesion species film.

2. The method of claim 1, wherein intermixing the adhesion species with the element comprises implanting the adhesion species into the sidewall of the element.

3. The method of claim 2, wherein implanting the adhesion species into the sidewall of the element comprises performing a plasma doping process at an energy less than 3 keV.

4. The method of claim 1, wherein implanting the dielectric material into the adhesion species film comprises a plasma doping process at an energy within the range of 0-2 keV.

5. The method of claim 1, wherein forming the adhesion species comprises performing both a plasma doping process and a deposition process.

6. The method of claim 5, wherein performing the plasma doping process comprises performing a plasma doping of boron into the sidewall of the element of the memory stack.

7. The method of claim 6, wherein implanting the dielectric material into the film comprises implanting a nitride forming material into the film to form a boron and nitride ($BN_x$) dielectric film.

8. The method of claim 1, wherein forming the memory stack comprising forming multiple stacked elements comprising:
- forming a word line material;
- forming a first electrode material over the word line material;
- forming a variable resistance material over the second electrode material; and
- forming a second electrode material over the phase change material.

9. The method of claim 8, wherein at east one of the first and second electrode materials includes carbon.

10. The method of claim 9, wherein the boron adhesion species terminates unsatisfied atomic bonds of the carbon.

11. The method of claim 8, wherein forming the word line material comprises forming a material including tungsten.

12. A method for fabricating a memory device comprising:
- forming multiple memory stacks defined in part by sidewalls, each memory stack fabricated by:
  - forming a first electrode over a word line material;
  - forming a variable resistance material over the first electrode;
  - forming a second electrode over the variable resistance material; and
  - patterning and etching the first and second electrodes and the variable resistance material to form the multiple memory stacks;
- forming an adhesion species on at least one sidewall of each of multiple memory stacks using a doping process and a deposition process, wherein the adhesion species comprises a first portion implanted to intermix with at least one element of the memory stack, and a second portion comprising a film of the adhesion species over the first portion; and
- forming a liner material on the sidewalls of multiple memory stacks by implanting a dielectric material into the film of the adhesion species.

13. The method of claim 12, wherein forming the adhesion species comprises forming a gradient structured adhesion species on the sidewalls, comprising:
- using a plasma doping process to implant a boron species; and
- using a deposition process to form a boron film on the sidewall over the implanted boron species.

14. The method of claim 12, wherein forming the liner material comprises forming a boron and nitride ($BN_x$) liner material over at least one of the first and second electrodes.

15. The method of claim 12, further comprising forming a dielectric fill material between pairs of the memory stacks.

16. The method of claim 12, wherein forming the liner material comprises forming the liner material through a plasma doping process at a temperature of less than 390° C.

* * * * *